(12) United States Patent
Wynne

(10) Patent No.: US 9,291,647 B2
(45) Date of Patent: Mar. 22, 2016

(54) LOW-COST ROGOWSKI COIL SENSORS

(75) Inventor: John Wynne, Limerick (IE)

(73) Assignee: ANALOG DEVICES, INC., Norwood, MA (US)

( * ) Notice: Subject to any disclaimer, the term of this patent is extended or adjusted under 35 U.S.C. 154(b) by 348 days.

(21) Appl. No.: 13/432,228

(22) Filed: Mar. 28, 2012

(65) Prior Publication Data

US 2013/0257412 A1      Oct. 3, 2013

(51) Int. Cl.
*G01R 15/18*      (2006.01)

(52) U.S. Cl.
CPC .................................... *G01R 15/181* (2013.01)

(58) Field of Classification Search
CPC ........................................................ G01R 15/181
USPC ................................... 324/127; 336/137–150
See application file for complete search history.

(56) References Cited

U.S. PATENT DOCUMENTS

| | | | | |
|---|---|---|---|---|
| 3,434,052 | A * | 3/1969 | Fechant .......................... | 324/127 |
| 4,456,873 | A * | 6/1984 | Schweitzer, Jr. .............. | 324/543 |
| 6,414,474 | B1 * | 7/2002 | Gohara et al. ............. | 324/117 H |
| 6,614,218 | B1 * | 9/2003 | Ray ................................. | 324/127 |
| 7,227,441 | B2 * | 6/2007 | Skendzic et al. .............. | 336/225 |
| 2006/0082356 | A1 | 4/2006 | Zhang et al. | |
| 2008/0211484 | A1 * | 9/2008 | Howell et al. .................. | 324/127 |
| 2011/0012589 | A1 * | 1/2011 | Greenberg ..................... | 324/127 |
| 2011/0148561 | A1 | 6/2011 | Lint et al. | |
| 2012/0019233 | A1 * | 1/2012 | Juge et al. ...................... | 324/127 |
| 2012/0126789 | A1 * | 5/2012 | Turpin ....................... | 324/117 R |

FOREIGN PATENT DOCUMENTS

FR      2923019 A1      5/2009

OTHER PUBLICATIONS

Shepherd et al. An Overview of Rogowski Coil Current Sensing Technology , http://www.dynamp.com/Idadocum.nsf/c2270fbdd892ac3e86256e75000ad88a/e710af6d3e0f6255862565d7004b19db/$FILE/Report.pdf.*
EE Publishers, Rogowski Coil Sensors http://www.ee.co.za/article/rogowski-coil-sensors.html.*
International Search Report and Written Opinion dated Jun. 20, 2013 in corresponding PCT Application No. PCT/US2013/034223.

* cited by examiner

*Primary Examiner* — Patrick Assouad
*Assistant Examiner* — Demetrius Pretlow
(74) *Attorney, Agent, or Firm* — Knobbe, Martens, Olson & Bear LLP

(57) ABSTRACT

In various embodiments, a low-cost Rogowski coil sensor including a coil wound around a flexible carrier is provided with a reliable parallel-entry closure mechanism.

22 Claims, 13 Drawing Sheets

LOW-COST ROGOWSKI COIL SENSORS

TECHNICAL FIELD

This invention relates generally to accurate, low-cost Rogowski coil current sensors and a method of manufacture thereof. More specifically, one embodiment is directed to a structure and a method for aligning the free and terminated ends of the sensor so as to close the sensor loop.

BACKGROUND

Alternating electrical currents can be measured inductively via the oscillating magnetic fields they generate. FIG. 1 illustrates, as an example, the magnetic field of a straight current-carrying wire 100, which is characterized by circular magnetic field lines 102 in a plane perpendicular to the wire 100. If the magnetic field strength varies due to variations in the underlying current, it can be measured with an induction coil 104 surrounding the field lines 102. In general, however, magnetic sensors are sensitive not only to the magnetic field of the wire of interest (hereinafter referred to as the "primary conductor"), but also to local interfering magnetic fields, which may result in incorrect current readings. Moreover, many traditional induction-based current sensors, such as, e.g., iron core transformers, suffer from rigidity and/or bulkiness that can hinder their installation in crowded spaces, and thus pose practical limits on their use for various applications.

Rogowski coil sensors can overcome many of the problems associated with other current-sensing technologies. FIG. 1 shows the basic structure of a typical Rogowski coil sensor 110 and illustrates its operating principle. The sensor 110 includes a measurement head comprising a helical coil 112 wound around a typically non-ferrous core (e.g., in the simplest case, air), with a return path 114 routed from the end 116 of the coil back to the beginning 118. The end where the coil 112 turns into the return path 114 is commonly referred to as the "free end" of the measurement head or sensor; the other end, where the beginning 118 of the coil 112 and the end of the return path 114 are located, is called the "terminated end." The measurement head is bent into a substantially closed path (or "loop") around the primary conductor 100. (The term "substantially closed," as used herein, allows for a small gap or overlap between the free and terminal ends of the measurement head, which generally cannot be completely avoided in practice, but which do not affect measurements to a level greater than 5%.) To facilitate easy use and re-use of the sensor 110, and to avoid the need to disconnect the conductor to facilitate sensor placement, the measurement head may be sufficiently flexible to allow the loop to be opened and closed repeatedly.

Variations in the magnetic field surrounded by the turns of the coil 112—i.e., the magnetic field of the primary conductor 100—induce a voltage between the terminals 120, 122 of the measurement head (i.e., the beginning of the coil 112 and the end of the return wire 114). The return path 114 serves to subtract out any additional voltages that might be induced between the ends 116, 118 of the coil 112 due to magnetic fields 130 encircled by the coil loop. Thus, the measurement head allows currents to be measured in the primary conductor 100 while rejecting unwanted signals from interfering magnetic fields. Typically, the return path 114 runs along a center axis of the coil 112. However, alternative arrangements, such as a return coil wound on top of the first layer of coil turns, may also be used. To improve measurement accuracy, most Rogowski coil sensors 110 further include an integrator circuit 124 connected between the terminals 120, 122 of the measurement head. The integrator circuit 124 integrates the induced voltage over time, thereby restoring the original waveform of the measured alternating current.

To provide accurate current readings, the Rogowski coil sensor 110 preferably has a coil 112 of uniform cross-section and constant turn density, i.e., uniform spacing between adjacent turns. However, non-uniformities typically arise in the closure region of the coil loop, due to either a gap or an overlap between the free end and the terminated end. While compensatory electronics can, in principle, reduce the impact of these non-uniformities, it increases the cost of the sensor and requires each sensor to be individually calibrated and tuned. Thus, commercially available sensors generally suffer from a trade-off between measurement accuracy and price. The problem is exacerbated in portable measurement applications, where the sensor may need to be re-tuned after each installation around a new conductor (which is not necessary if the sensor is mounted permanently around one primary conductor). A need exists, therefore, for low-cost, flexible, and portable Rogowski coil sensors that reliably provide accurate current measurements for different conductors.

SUMMARY

The present invention provides Rogowski-coil sensors that are inexpensive to manufacture and easy to deploy while providing a reliable mechanism for precisely aligning the free and terminated ends of the coil in proximity to one another and, thereby, achieving high measurement accuracy of the sensor loop. In various embodiments, the coil is wound around a flexible, belt-like carrier (made of, e.g., injection-molded plastic) in which a return-path conductor is embedded. The carrier may extend beyond the length of the coil on either or both ends, allowing the free end of the coil wiring to circumferentially abut the terminated end (such that the two ends of the coil are aligned and flush with a plane perpendicular to the coil axis) while the two end portions of the carrier overlap. A combined cap, guide clip, and locking mechanism may be located at one end of the carrier to cover a cavity in the carrier, aid alignment of the carrier ends when the sensor is bent into a loop around a primary conductor, and fasten the ends of the carrier together, respectively. The guide clip may have a rectangular cross section with a high aspect ratio (e.g., a width-to-height ratio of at least 2:1), which provides naturally aligned planar edges.

To restrict relative motion between the free and terminated ends and lock them into a closed configuration, the locking mechanism may include a push-on closure mechanism (akin to that of a belt buckle) or, alternatively, a closure mechanism akin to that of a parallel-entry cable tie. The guide clip, located at one end of the carrier, receives the other end of the carrier so as to align the ends laterally (i.e., in a direction perpendicular to the axis of the coil and, thus, the circumference of the sensor loop). The locking mechanism may be configured to provide a fixed, predetermined diameter of the sensor loop. This predetermined diameter may be achieved by producing carriers and by implication, bobbins of a specific length. Such a carrier has only a single closed position leading to a loop of pre-determined circumference being formed. These loops are predetermined, repeatable, and are either set by the length of the carrier or by the lateral position of molded lugs on the carrier itself. The bobbin may be designed to form an exact closed loop when its carrier is closed.

In one aspect, a Rogowski coil sensor includes a flexible carrier comprising a first end and a second end and a conductive wiring arrangement comprising a coil wound around the carrier and a return-path conductor. A combined unit, located at the first end of the carrier, is configured to (i) slidably receive the second end of the carrier therethrough so as to align the first end with the second end along an axis of the coil and (ii) fasten the first end to the second end so as to lock the sensor into a closed-loop configuration.

The combined unit may be further configured to seal a cavity within the first end of the carrier and may include a guide clip for slidably receiving the second end of the carrier, a locking mechanism for fastening the first end to the second end, and a cap having molded locating pins for sealing the cavity. The locking mechanism may include a pawl, and the second end of the carrier may include a slot for engaging with the pawl (the pawl and slot together forming a ratchet). The locking mechanism may also or instead include a locking post, and the second end of the carrier may also or instead include a guide hole. The carrier may include a polymer material and/or electronic circuitry. The carrier and the cavity may form a polymer structure injection-molded in one piece.

The combined unit may include a structure separate from the carrier and affixable thereto, and/or may be fixedly located at the first end of the carrier. The carrier may include a helical groove around a surface thereof for retaining the return-path conductor therein. The return-path conductor may be coaxially routed back through the coil or embedded in the carrier. A cross-section of the carrier may be rectangular, and may have an aspect ratio of at least 2:1. The combined unit may restrain relative motion between the first and second ends along the axis of the coil and/or restrain radial movement between the first and second ends along a radial path. In the closed-loop configuration, a free end of the coil may be flush with a terminated end of the coil in a plane perpendicular to the axis of the coil and/or a turn density of the coil may be substantially constant throughout the loop.

In another aspect, method of measuring an electrical current through a cable uses a Rogowski sensor comprising a flexible carrier, a conductive wiring arrangement comprising a coil wound around the carrier, and a return-path conductor embedded in the carrier. The sensor is wrapped around the cable into a closed-loop configuration having a desired closed length. A second end of the carrier is inserted into a combined unit disposed at a first end of the carrier so as to slidably receive the second end of the carrier therethrough so as to align the first end with the second end along an axis of the coil and fasten the first end to the second end so as to lock the sensor into a closed-loop configuration. The sensor is secured in the closed-loop configuration and an electrical connection is established between the coil and the return path.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and can exist in various combinations and permutations. Unless otherwise defined herein, the term "substantially" means±10% (e.g., by length), and, in some embodiments, ±5%.

BRIEF DESCRIPTION OF THE DRAWINGS

The foregoing will be more readily understood from the following detailed description, in particular, when taken in conjunction with the drawings, in which.

DETAILED DESCRIPTION

Figure 1:
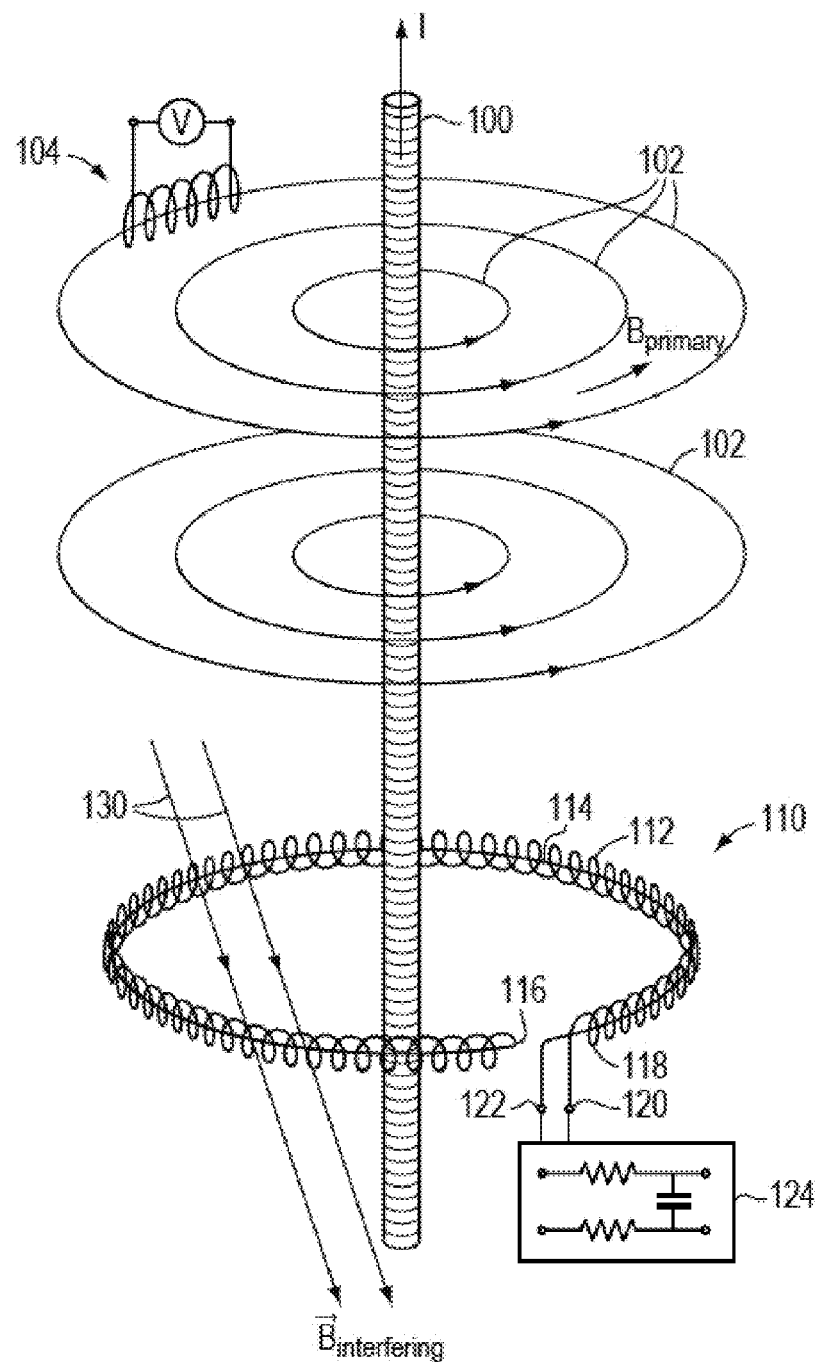
FIG. 1 schematically illustrates the structure and operating principle of an exemplary Rogowski coil sensor.
Figure 2:
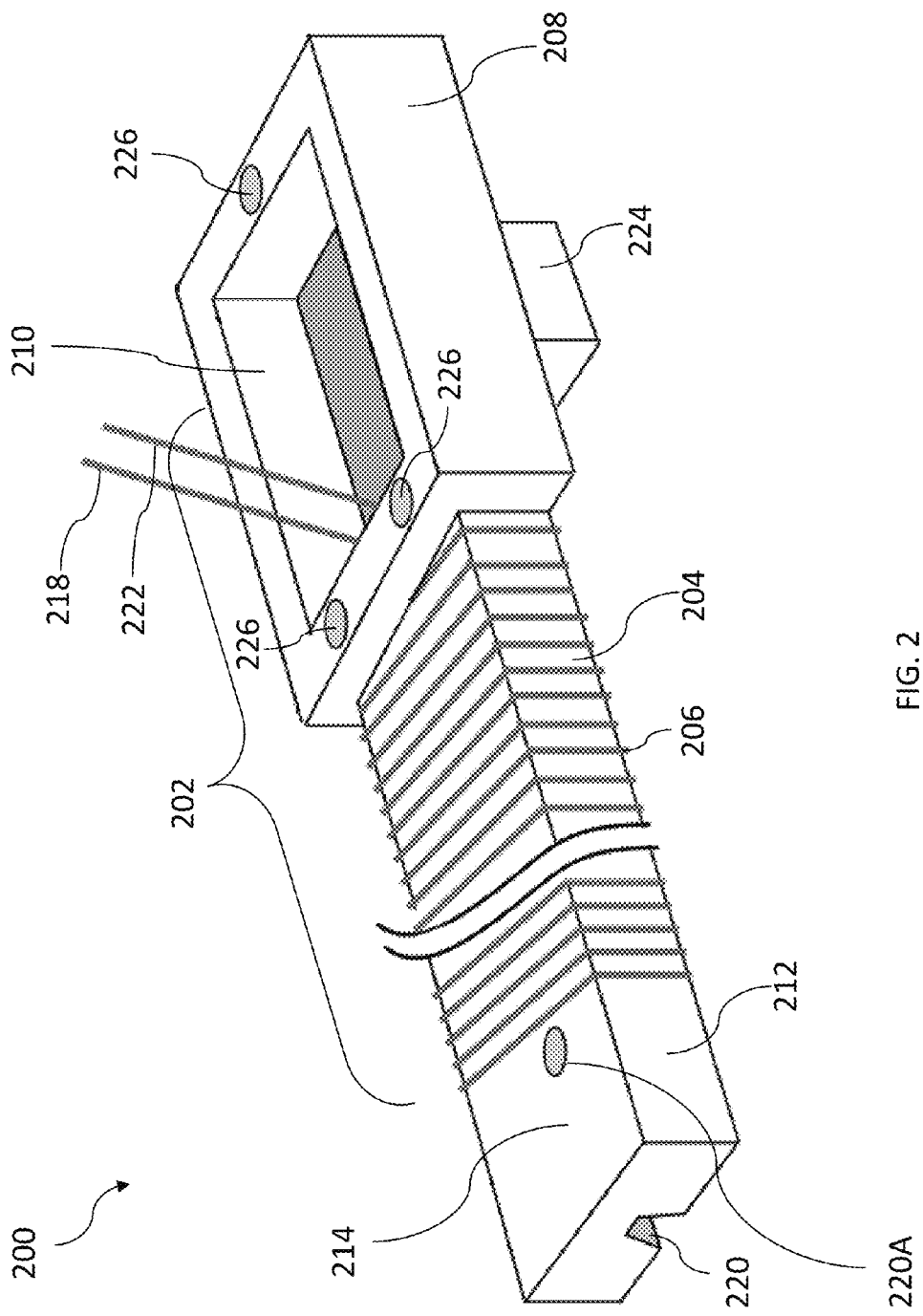
FIG. 2 is a schematic perspective view of a carrier of a Rogowski coil sensor in accordance with one embodiment.

FIG. 2 illustrates a Rogowski coil sensor 200 in accordance with one embodiment of the invention. The sensor 200 includes a belt-like carrier 202 that is structured into three portions: a center portion 204 (or "bobbin") around which a coil 206 is wound, a first end portion 208 that corresponds to the terminated end of the sensor 200 and includes a head module 210 containing sensor electronics, and a second end portion 212 that corresponds to the free end and includes an area 214 that has a locking mechanism (such as a guide hole for a locking pin, slots to engage with a pawl, or any other such mechanism, as explained in greater detail below).

As shown, the carrier 202 has a rectangular cross section and a width w that exceeds its thickness d, e.g., by a ratio of at least 2:1. Such high aspect ratios, along with the planar top and bottom surfaces of the carrier 202, aid the alignment of the free and terminated ends during closure of the loop. However, several advantages of the preferred embodiments described herein can be retained in configurations in which the carrier cross section has a low aspect ratio or deviates from a rectangular shape; for example, the carrier may have a quadratic, general polygonal (e.g., hexagonal) or round (e.g., circular or elliptical) cross section.

The carrier 202 may be manufactured from a flexible material, such as, e.g., a soft plastic, so that it may be folded or bent around a primary conductor. A first end 218 of the coil 206 winds around the carrier 202 to the end 212 and returns via a central slot 220. Access to this central slot may be achieved via an opening 220A leading from the outside of the bobbin to the central slot. The return winding is made available to the head module 210 via a second end 222 of the coil 206. A molding 224 underneath the head module 210 may contain connector pins to allow communication between the sensor electronics within the head module 210 and, e.g., an external meter. Guide holes 226 in the first end portion 208 of the carrier 202 may be used to mate with a cap unit, as described below in more detail with reference to FIG. 3.

Figure 3:
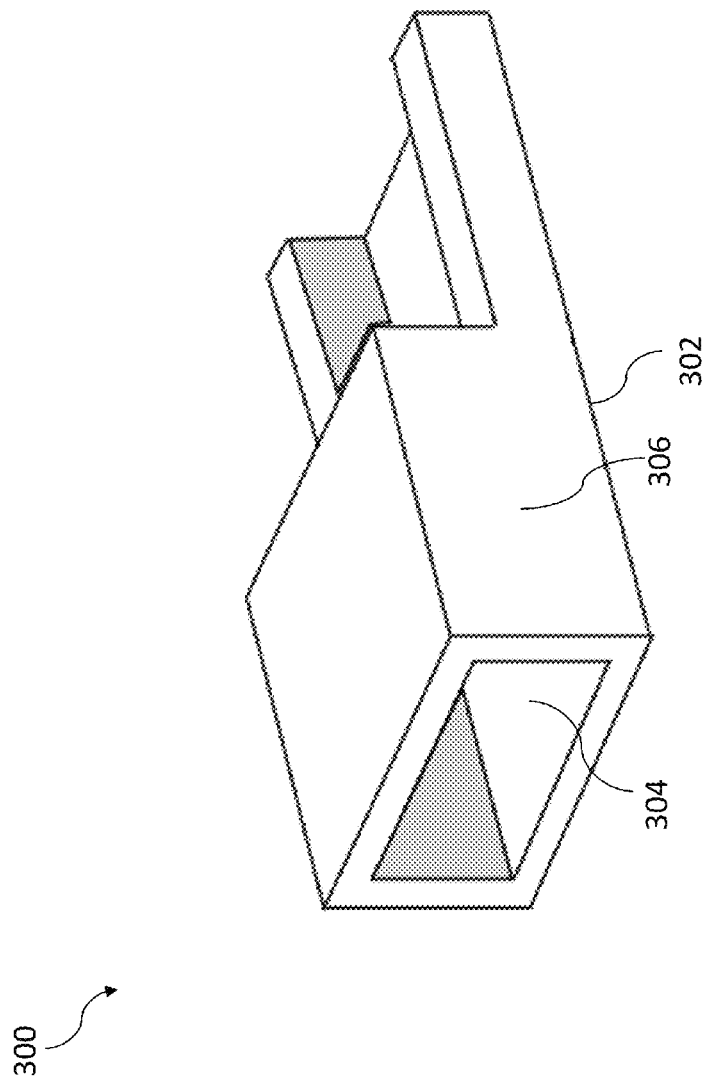
FIG. 3 is a schematic section view of a combined cavity cap, guide clip, and locking mechanism for a Rogowski coil sensor in accordance with one embodiment.

FIG. 3 illustrates one embodiment of a combined unit 300 that includes a cap, guide clip, and locking mechanism. A bottom surface 302 of the combined unit 300 mates with the guide holes 226 in the first end 208 of the carrier 202 to thereby cover and seal the sensor electronics in the head module 210. The second end 212 of the carrier 202 wraps around a conductor or conductors to be measured and is received in an opening 304 in the combined unit 300. A side-wall 306 of the combined unit 300 ensures correct alignment between the beginning and end of the coil 206, as explained in greater detail below. The combined unit 300 may contain a molded pawl or locking pin (not shown) to engage with the second end 212 of the carrier 202.

Figure 4:
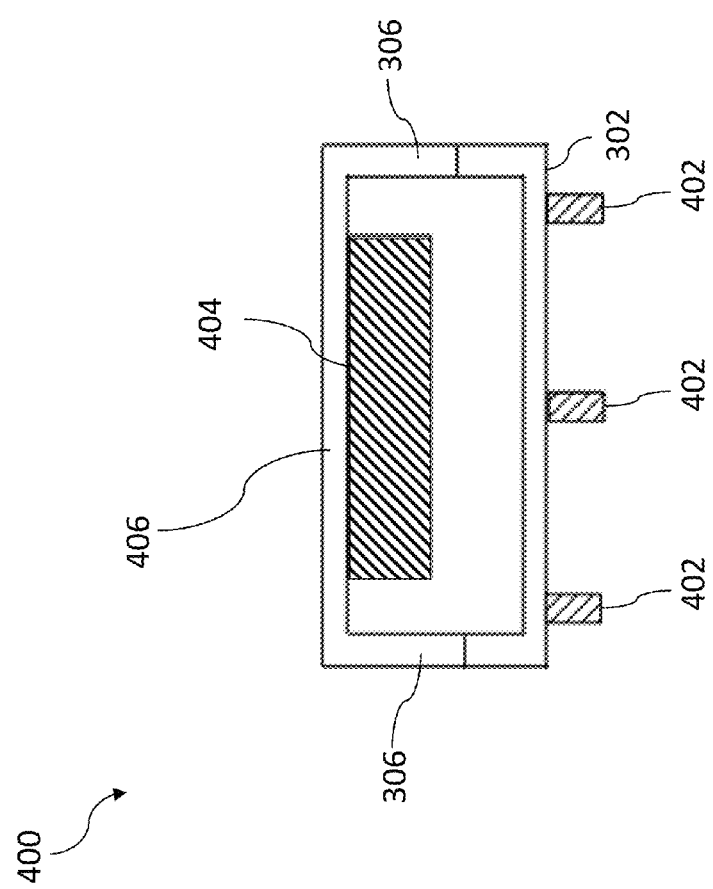
FIG. 4 is an end view of the combined cavity cap, guide clip, and locking mechanism in accordance with one embodiment.
Figure 5:
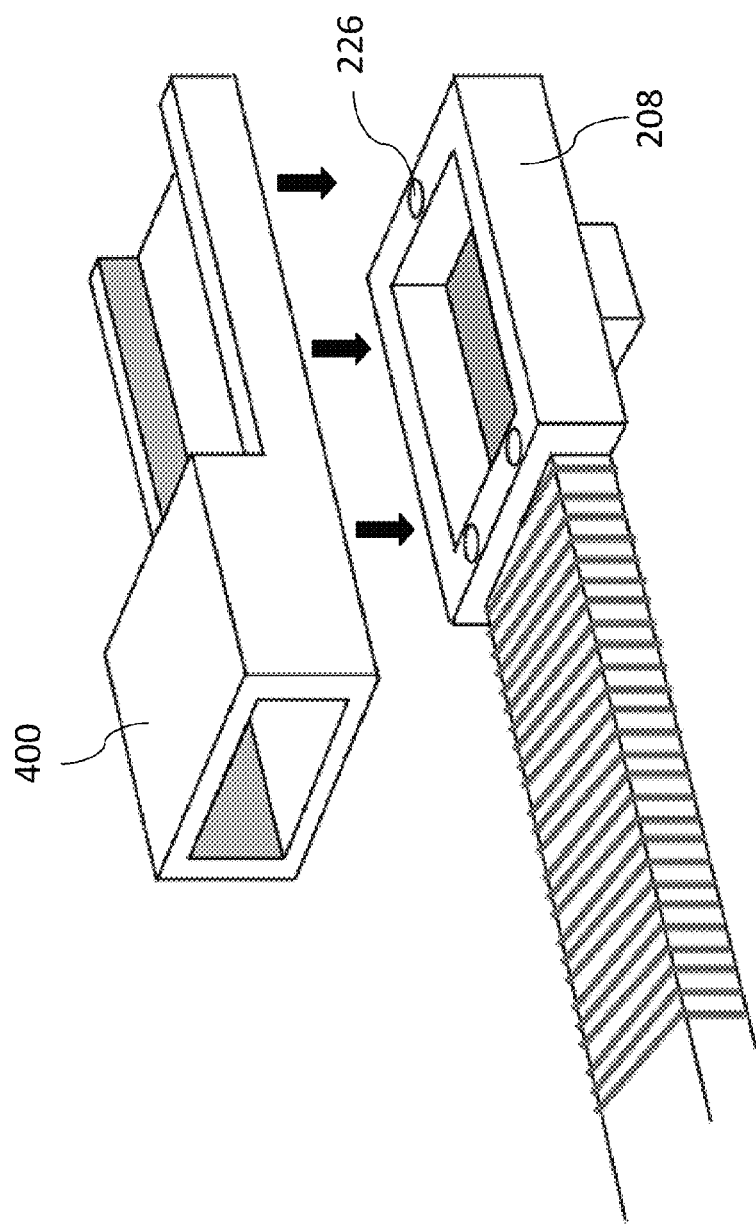
FIG. 5 is a schematic perspective view of the combined cavity cap, guide clip, and locking mechanism being mated with the carrier in accordance with one embodiment.
Figure 8:
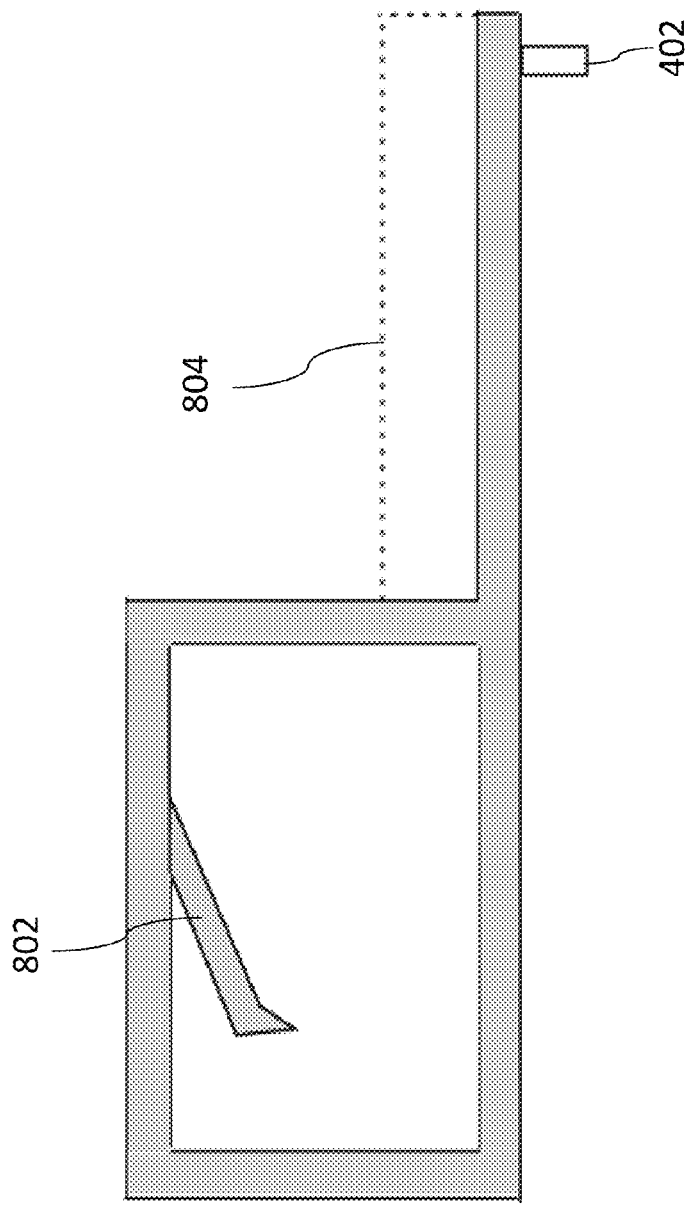
FIG. 8 is a length-wise cross section of the combined cap, guide clip, and locking mechanism showing a pawl mechanism similar to that of a cable-tie ratchet mechanism in accordance with one embodiment.

A cross-section of one embodiment 400 of the combined unit 300 (see FIG. 3) and of the sidewalls 306 is shown in FIG. 4. Also shown are pins 402 on the bottom surface 302 for mating with the guide holes 226. In this embodiment, a locking ratchet 404, attached to a top portion 406 of the unit 300, is used for interfacing with the second end 212 of the carrier 202. The ratchet 404 may contain a molded pawl, as explained in greater detail below with reference to FIG. 8. FIG. 5 illustrates how the combined unit 400 may attach to the holes 226 in the first end 208 of the carrier 202.

Figure 6:
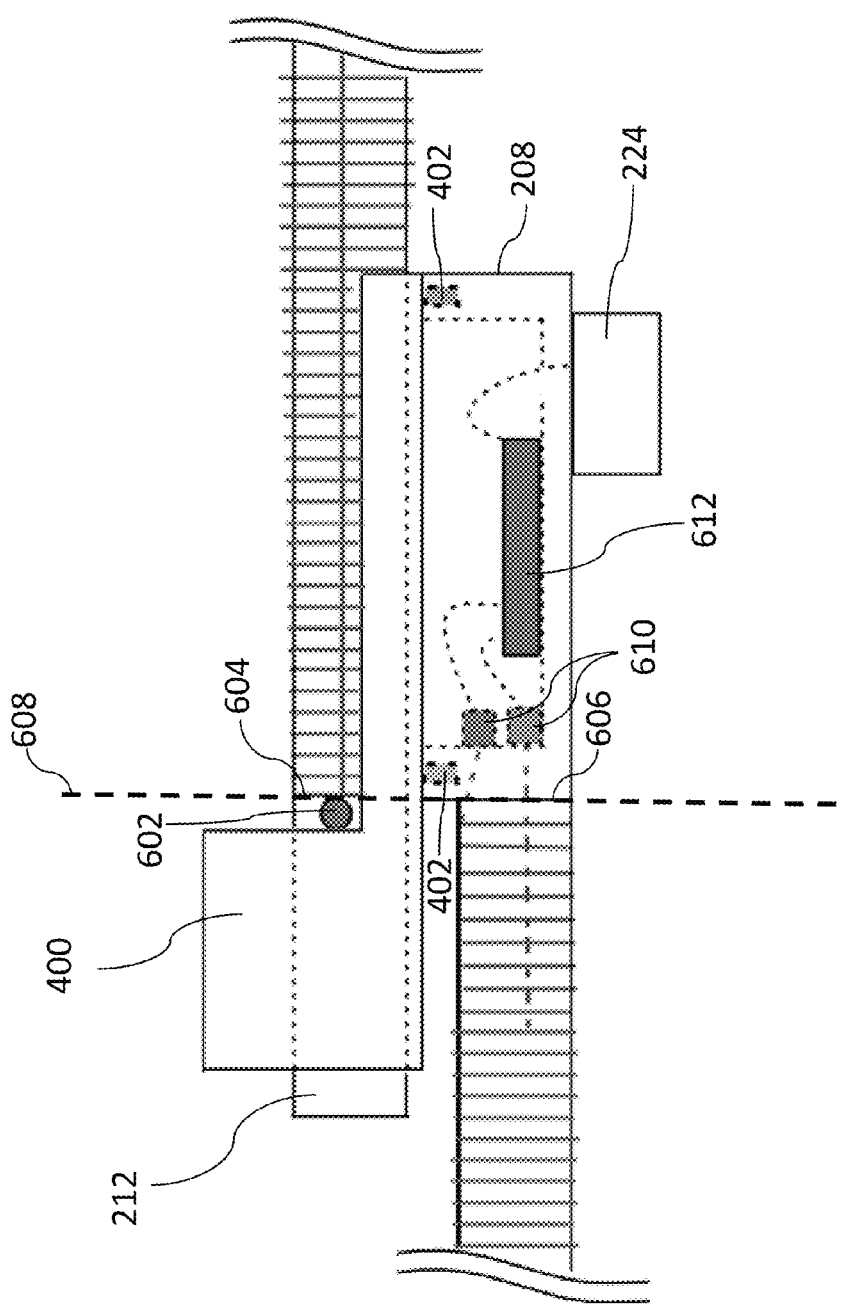
FIG. 6 is a schematic section view of the Rogowski coil sensor of FIG. 5, illustrating the free end of the carrier and the molded opposing lugs in accordance with one embodiment.

The combined unit 400, first end 208 of the carrier 202, and second end 212 of the carrier 202 are shown in side view in FIG. 6; the combined unit 400 is attached to the first end 208, and the second end 212 is shown after its return from around the conductor and attached to the combined unit 400. A molded lug 602 may act as an end-stop for the carrier locking mechanism, thereby insuring that the two ends 604, 606 of the coil 206 terminate in the same plane (represented by a dashed line 608. Note that the first turn of the coil winding at the terminated end is located one pitch away from the plane of 608). One molded lug 602 is shown; another lug 602 may be used on the opposite side of the second end 212 of the carrier 202. FIG. 6 also illustrates anchors 610 for the two ends 218, 222 of the windings of the coil 206 and sensor electronics 612 (e.g., a signal-conditioning chip). Also shown are locating pins 402 used to secure the combined unit 400 to the carrier 202.

Figure 7:
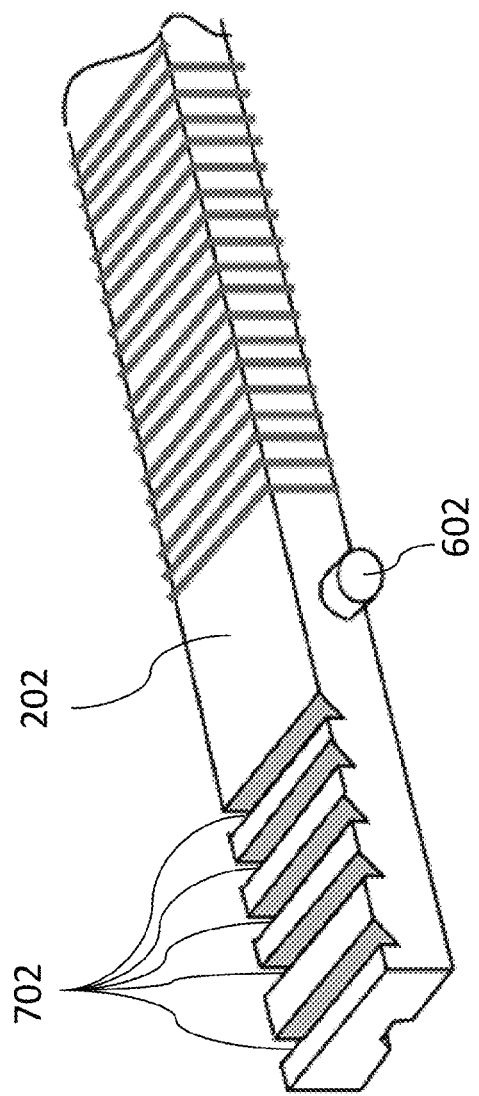
FIG. 7 is a schematic view of slots in the carrier for engaging with the locking mechanism in the combined cap, guide clip, and locking mechanism in accordance with one embodiment.

Part of the locking mechanism used in this embodiment is shown in greater detail in FIG. 7. The carrier 202 is shown with the molded lug 602, as described above. Also shown are slots 702 that may be used to engage a pawl in the combined unit 400. The pawl engages the slots 702 in the carrier 202, as is shown in cross section in FIG. 8, along with a dotted representation 804 of the low-rise guide walls that position the carrier correctly. One of the rear locating pins 402 is also shown. In operation, the carrier 202 is wrapped around a conductor 100, and the first end 208 (with the attached combined unit 400) is brought into proximity with the second end 212. The second end 212 is inserted into the opening 304 in the combined unit 400 and slid therethrough, until the slots 702 engage with the pawl 802. As one of skill in the art will understand, the pawl 802 and slots 702 are configured such that the second end 212 may move in only one direction through the opening 304; the pawl 802 engages one of the slots 702 and prevents the second end 212 from withdrawing. The second end 212 may be drawn through the opening 304 until the molded lugs 602 contact a surface of the combined unit 400, thereby preventing further insertion of the second end 212.

Figure 9:
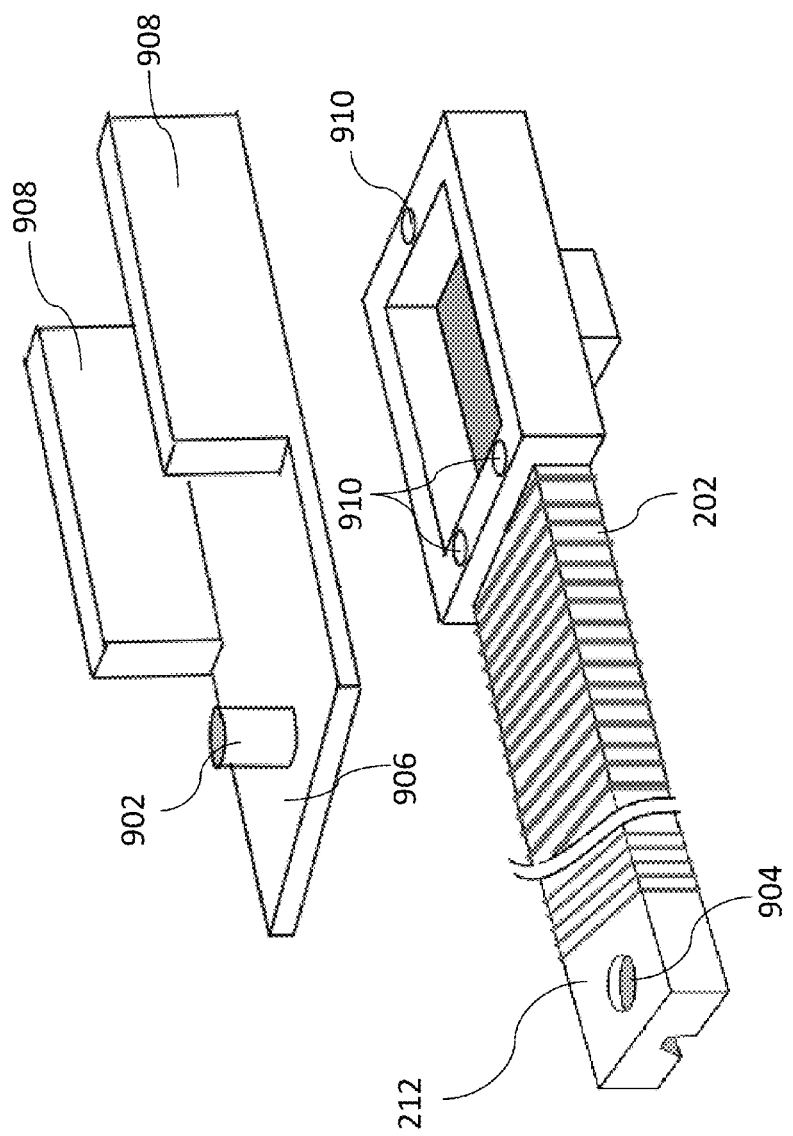
FIG. 9 is schematic section view of another type of locking mechanism for the Rogowski coil sensor of FIG. 2 showing a combined cap, guide clip, and locking mechanism in accordance with one embodiment.
Figure 10:
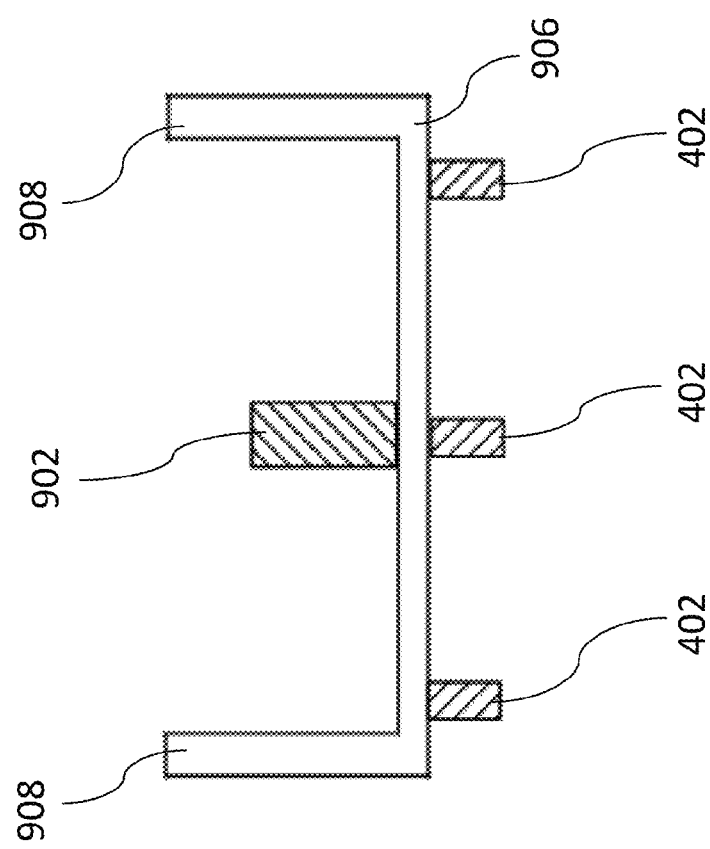
FIG. 10 is an end view of the combined cap, guide clip, and locking mechanism showing the central locking post and the locating pins for locating the combined cap, guide clip, and locking mechanism onto the carrier structure of FIG. 2 in accordance with one embodiment.

In another embodiment, illustrated in FIG. 9, a locking post 902 and a guide hole 904 are used to lock the carrier 202 in place. In this embodiment, the combined cap, guide clip, and locking unit 906 includes the locking post 902, sidewalls 908 for ensuring correct alignment of the carrier 202, and locating pins 402 (not shown in FIG. 9) for mating with holes 910 in the carrier 202. The full length of the carrier 202 is not shown in FIG. 9; the second end 212 wraps around such that the guide hole 904 engages with the guide post 902. The guide hole 904 may be used alone or in combination with the opening 220A that provides access to the central slot 220, as described above with reference to FIG. 2. FIG. 10 illustrates a frontal view of the combined unit 906, again showing the locking post 902, sidewalls 908, and locating pins 402. To use this embodiment, a user wraps the carrier 202 around a conductor 100, and the first end 208 (with the attached combined unit 400) is brought into proximity with the second end 212, as described above. The second end 212 is placed within the sidewalls 908 of the combined unit 400, and the second end 212 is positioned such that the guide hole 904 mates with the locking post 902. Once mated, tension exerted from the force of the carrier 202 wrapped around the conductor 100 keeps the second end 212 attached to the combined unit 400.

Figure 11:
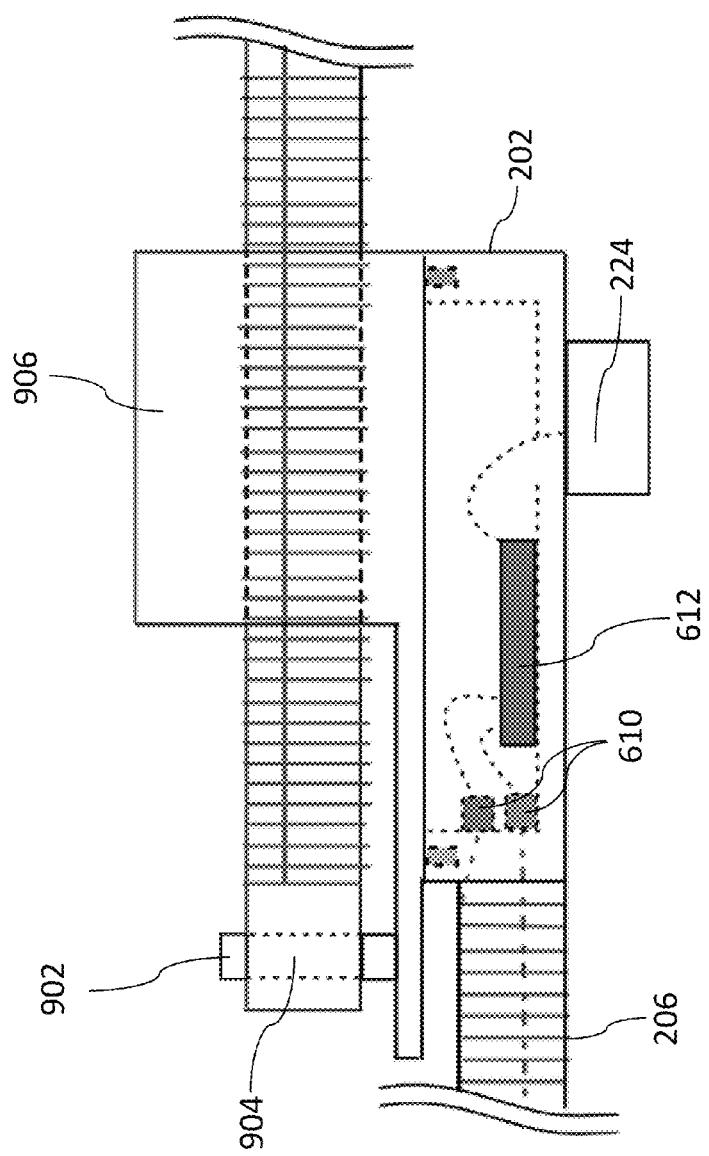
FIG. 11 is a schematic section view of the Rogowski coil sensor of FIG. 2 mated with the combined cap, guide clip, and locking mechanism of FIG. 9, illustrating the free end of the carrier being locked into its final position by the locking post in accordance with one embodiment.

The combined unit 906 is shown mated to the carrier 202, and the locking post 902 is shown engaged with the guide hole 904, in FIG. 11. It is also feasible that post 902 may incorporate a molded lip to prevent subsequent radial movement once the free end of the carrier is pressed onto the post. As described above with reference to FIG. 6, anchors 610 may be used to secure the coil 206, which may be electrically connected to sensor electronics 612. A molding 224 may contain connector pins to allow external communication.

Figure 12:
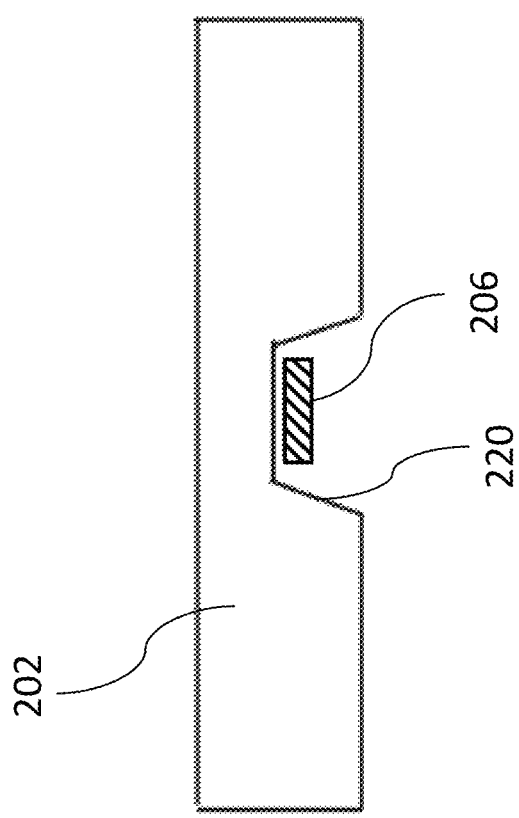
FIG. 12 is a cross-section through the carrier and return path conductor of the Rogowski coil sensor of FIG. 2 in accordance with one embodiment.

FIG. 12 illustrates a sectional view of the carrier 202 that includes the central slot 220. As shown and as described above, the return path of the coil 206 is disposed in the central slot 220. The conductor may be placed in the central slot 220 alone, if the material comprising the carrier 202 is non-conducting, because the return path of the coil 206 is physically separated by the outgoing, coiled portion of the coil 206 by virtue of the depth of the central slot 220. In other embodiments, the return path of the coil 206 is covered or coated with an insulating material.

Figure 13:
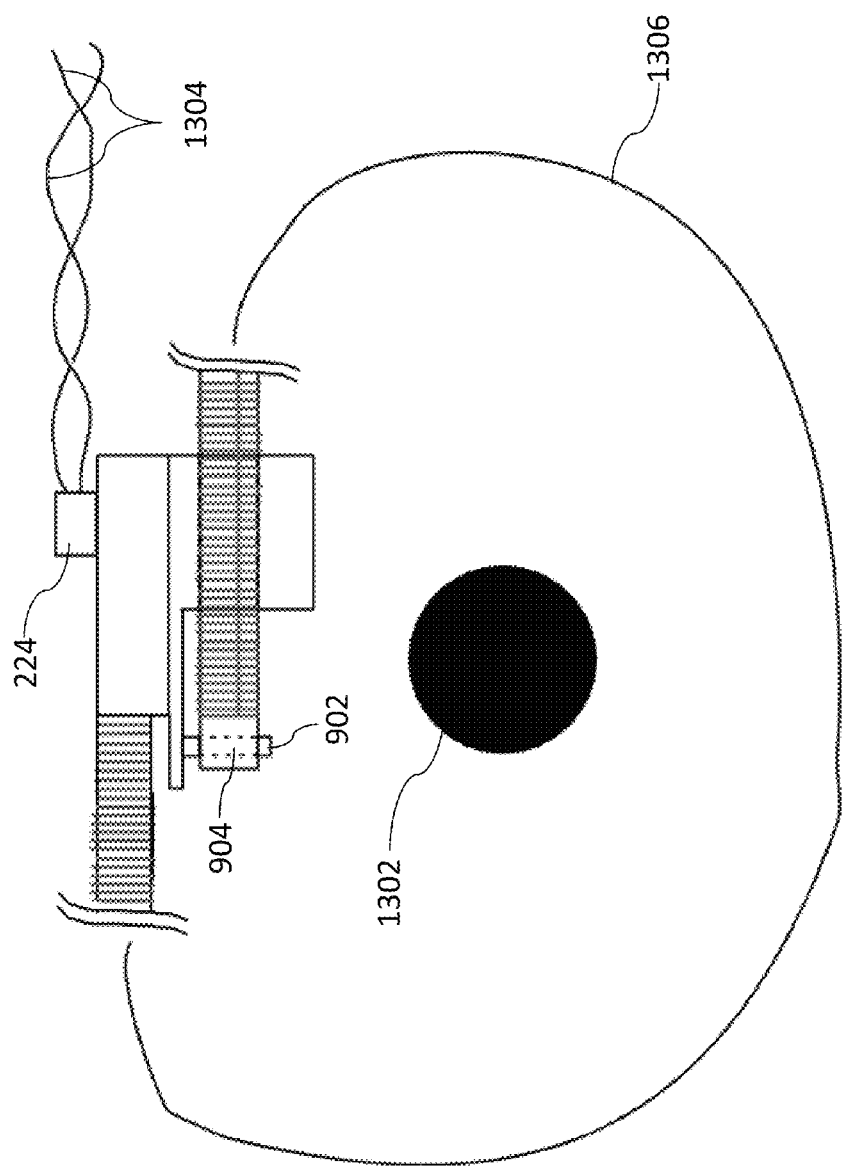
FIG. 13 is a schematic cross section of the Rogowski coil sensor showing the assembly in place around a central conductor in accordance with one embodiment.

An embodiment of the invention is shown in place around a current-carrying conductor 1302 to be measured in FIG. 13. The locking post 902 and guide hole 904 are shown in cross-section, and wires 1304 are shown connected to the molding 224 to provide a connection to an external device (e.g., a meter). The portion of the carrier 202 and coil 206 encircling the conductor 1302 is represented by a curved line 1306. As described above, a user may wrap the carrier 202 around the conductor 1302 and secure the first 208 and second 212 ends of the carrier 202 using the combined unit 400.

As illustrated in (for example) FIG. 6, the turn density of the coil is typically substantially constant throughout the length of the winding. In certain embodiments, the combined cap, guide clip, and locking mechanism is deliberately placed such that the free end of the coil winding is, in the closed configuration of the sensor, axially flush with the terminated end (as shown by the dotted line 608 in FIG. 6), or, in other words, such that the last turn of the coil winding at the free end is circumferentially separated from the first turn of the coil winding at the terminated end by one pitch, i.e., by the distance between two adjacent coil turns along the winding (within an acceptable error margin, e.g., ±10% or, in some embodiments, ±5%). As a result, the turn density is substantially constant throughout the sensor loop, which generally increases the measurement accuracy of the sensor, and may eliminate the need for compensatory electronic circuitry. The spacing between the first and last coil turns may be adjusted, if necessary, to compensate for any measurement error introduced by the radial (or "vertical") distance between the free and terminated ends that results from the overlap of the carrier ends in the loop configuration. Advantageously, the preferably high aspect ratio of the carrier keeps the radial distance, and any distorting effect it may have, small.

In the sensor embodiments illustrated in FIGS. 9-11, the sensor loop has a specific, pre-determined circumferential length in the closed configuration (and, thus, the loop, if circular, has a fixed, predetermined diameter) determined by the position of the guide pin molded into the free end of the carrier. FIGS. 2-8 schematically illustrate an alternative sensor in which the length of the loop is determined by the lateral position of opposing molded stop lugs located at the free end of the carrier. The free end of the sensor is inserted into the combined cap, guide clip, and locking mechanism until the opposing molded stop lugs, protruding from the carrier, hit the wall of the anchor thereby preventing any further tightening of the loop; the stop lugs thus establish a minimum diameter of the sensor loop. Different sensor circumferences may be produced by placing the molded stop lugs at different lateral positions along the free end of the carrier.

Rogowski coil sensors, as described above, may be manufactured in various sizes and with relative dimensions that depend on the particular application. In one exemplary embodiment, the total length of the sensor is about 300 mm, including a 260 mm long coil winding with 260 turns and a pitch of 1 mm. The coil, when wound around the carrier, may have a cross-sectional dimension of about 2.5 mm×7 mm; a typical return-path conductor may be 1.5 mm wide and 0.1 mm thick. When the ends of the coil are connected, the inside diameter of the sensor loop may be between about 7 cm and about 9 cm.

The carrier may be injection-molded in a flat layout, using techniques well-known to those of skill in the art. In brief, liquid polymer is poured into a mold cavity (the mold being made, e.g., of a metal), cured, and then removed to obtain the completed plastic part. The bobbin (i.e., the carrier part around which the coil is wound) and end portions of the carrier, which may have the head cavity/module integrated therein, are, in various embodiments, molded in one piece. Similarly, the combined cavity cap, guide clip, and locking mechanism of (e.g.) FIG. 9 is likewise designed such that it can be manufactured in one piece without side action. Similarly the combined cavity cap, guide clip, and locking mechanism of FIG. 3 may be molded in one piece but possibly necessitating side action.

The return path, which may be made of any suitable conductor material (e.g., copper), may be insert-molded into the carrier, i.e., positioned inside the mold during the molding process such that the polymer cures with the return-path conductor already in place. Alternatively, the carrier may be manufactured with a properly sized cavity or slot created length-wise in the carrier, into which the return-path conductor is received after fabrication of the plastic part. In yet another embodiment, the carrier may be formed of multiple pieces that are assembled with the return-path conductor, and then bonded or otherwise attached to each other to form a single structure. In certain embodiments, the carrier is produced from an off-the-shelf jacketed conductor. In yet another embodiment, the return path carrier and the coil winding may be formed with a single continuous electrical conductor; the return path is filled first with the conductor and held in place by suitable means and then the conductor is brought to the outside of the bobbin and is wound helically back along the bobbin towards the terminated end.

To accommodate the coil winding, a helical track may be molded into the bobbin, yielding accurate and consistent individual turns and turn-to-turn spacing. A conductive wire (which may be made of copper or another suitable material) is then wound into the track. Preferably, the winding is continuous, i.e., does not include any breaks that could reduce measurement accuracy. In some embodiments, the wire is wound around a carrier having a smooth surface without grooves. The wire may be insulated from its surroundings with a thin sheath, such as a polymer overmold, a heat-shrink tubing (i.e., a sheath made of, typically, nylon or polyolefin, that shrinks when heated) or extruded tubing, or an adhesive coating.

Once the coil and return-path conductor have been integrated with the carrier, they may be electrically connected at the free end, e.g., by soldering. Alternatively, a conductive connection can be formed via the molding process. At the terminated end, a pre-fabricated electronic circuit may be connected between the coil and return path. Finally, any separately manufactured components, such as, e.g., the retention clip, may be assembled onto the carrier to yield the final sensor product.

In use, the Rogowski coil sensor may be wrapped around an electric cable under observation, closed to form a loop, and pulled tight. Typically, the sensor is bent into a single, substantially circular or oval loop. However, flexible sensors as described herein may be bent into any desirable shape (e.g., a figure-eight shape). Thus, they may be used without difficulty in tight spaces. The terminal-end portion of the carrier, which typically includes the head module, may be stiffer than the bobbin portion and may, as a result, remain relatively flat compared to the remainder of the sensor loop (such that the loop deviates from perfect circular shape). Advantageously, a straighter end portion reduces stress on the electronic circuitry, and thus lengthens the lifetime of the sensor. As illustrated above, certain sensor embodiments are configured for a particular diameter. This type of sensor may be beneficial in applications where a repeatable loop size, and hence a repeatable sensor sensitivity, is required for the sensing function.

An advantageous feature of Rogowski coil sensors in accordance with various embodiments is the accurate and reliable closure mechanism, which results in a tighter operating band, and facilitates installing the sensor around a cable without disconnecting the cable. Retro-fitting current sensors without interfering with the existing wiring or cabling is important in many current-sensing applications, including, for example, current monitoring in breaker boxes of residential or other buildings. A typical domestic breaker box has ten or more cables that take power to various circuits in the house. To enable "smart houses," electricity usage generally needs to be monitored for each circuit separately. This monitoring may be readily achieved using flexible Rogowski coil sensors as described herein, which may be installed around the cables without any need to rearrange the existing wiring. Further, the high closure integrity of the sensor locking mechanism, which minimizes or substantially eliminates sensor susceptibility to magnetic interference, crosstalk, and unwanted signal pickup, results in accurate current readings. As will be readily apparent to one of skill in the art, Rogowski coil sensors as described herein may be also be advantageously employed in many other contexts.

Certain embodiments of the present invention are described above. It is, however, expressly noted that the present invention is not limited to those embodiments. Rather, various additions and modifications, as well as combinations of various features described herein, are also included within the scope of the invention. For example, coil closure mechanisms may generally include any suitable combination of one or more alignment, retention, or anchor structures, and such structures may deviate from the specific structures described above without losing their relevant functions (e.g., a push-through structure may be replaced by a hook-and-loop structure). Depending on the intended application, the alignment, retention, and anchor structures may or may not be releasable. Further, while in the preceding description of (e.g.) FIG. 6, the free coil end is affixed to the outer surface of the loop, the closure mechanism may be straightforwardly adjusted for affixation of the free end to the inner surface of the loop as shown in (e.g.) FIG. 13. The alignment and/or retention structures may also be located at the free instead of the terminated end. In addition, closure mechanisms as described herein may be used in rigid or semi-flexible sensors or sensors with non-rectangular cross sections, and, conversely, various advantages of sensors that are flexible and/or have rectangular cross sections may be retained in combination with closure mechanisms other than the ones described herein. In particular, manufacturing techniques as described herein may be applied to alternative sensor designs. Many variations, modifications, and other implementations that do not depart from the spirit and scope of the invention will occur to those of ordinary skill in the art.

Thus, although the present invention has been described with reference to specific details, it is not intended that such details should be regarded as limitations upon the scope of the invention, except as and to the extent that they are included in the accompanying claims.

What is claimed is:

1. A Rogowski coil sensor comprising:
a flexible carrier comprising a first end and a second end;
a Rogowski conductive wiring arrangement comprising a coil disposed around the carrier and a return-path conductor such that an axis of the coil is parallel to an axis of the carrier; and
located at the first end of the carrier, a combined unit comprising at least two spaced apart walls, the combined unit configured to:
(i) slidably receive the second end of the carrier through an opening defined at least in part by the at least two walls, the opening extending along a longitudinal axis; and
(ii) fasten the first end to the second end so as to lock the sensor into a closed-loop configuration,
wherein, in the closed-loop configuration, the at least two walls of the combined unit overlap at least a portion of the coil along the axis of the coil, the longitudinal axis of the opening of the combined unit is generally parallel to the axis of the coil, the first end of the flexible carrier is offset from the second end of the carrier along a direction transverse to the longitudinal axis of the opening, and a free end of the coil is flush with a terminated end of the coil in a plane perpendicular to the axis of the coil.

2. The sensor of claim 1, wherein the combined unit is further configured to seal a cavity within the first end of the carrier.

3. The sensor of claim 2, wherein the combined unit comprises a guide clip for slidably receiving the second end of the carrier, a locking mechanism for fastening the first end to the second end, and a cap having molded locating pins for sealing the cavity.

4. The sensor of claim 3, wherein the locking mechanism comprises a pawl and the second end of the carrier comprises a slot for engaging with the pawl, the pawl and slot together forming a ratchet.

5. The sensor of claim 3, wherein the locking mechanism comprises a locking post and the second end of the carrier comprises a guide hole.

6. The sensor of claim 1, wherein the carrier comprises a polymer material.

7. The sensor of claim 2, wherein the cavity comprises electronic circuitry.

8. The sensor of claim 2, wherein the carrier and the cavity form a polymer structure injection-molded in one piece.

9. The sensor of claim 1, wherein the combined unit comprises a structure separate from the carrier and affixable thereto.

10. The sensor of claim 1, wherein the combined unit is fixedly located at the first end of the carrier.

11. The sensor of claim 1, wherein the carrier comprises a helical groove around a surface thereof for retaining the return-path conductor therein.

12. The sensor of claim 1, wherein the return-path conductor is coaxially routed back through the coil or embedded in the carrier.

13. The sensor of claim 1, wherein a cross-section of the carrier is rectangular.

14. The sensor of claim 13, wherein the cross section of the carrier has an aspect ratio of at least 2:1.

15. The sensor of claim 1, wherein the combined unit restrains relative motion between the first and second ends along the axis of the coil or restrains radial movement between the first and second ends along a radial path.

16. The sensor of claim 1, wherein, in the closed-loop configuration, a turn density of the coil is constant throughout the loop.

17. The sensor of claim 1, wherein a last turn of the coil at the free end is circumferentially separated from a first turn of the coil at the terminated end by one pitch.

18. A method of measuring an electrical current through a cable using a Rogowski sensor comprising a flexible carrier, a conductive wiring arrangement comprising a coil disposed around the carrier such that an axis of the coil is parallel to an axis of the carrier, and a return-path conductor embedded in the carrier, the method comprising:
wrapping the sensor around the cable into a closed-loop configuration having a desired closed length;
inserting a second end of the carrier into a combined unit disposed at a first end of the carrier so as to slidably receive the second end of the carrier through an opening defined at least in part by at least two walls of the combined unit so as to fasten the first end to the second end so as to lock the sensor into a closed-loop configuration, the opening extending along a longitudinal axis; and
securing the sensor in the closed-loop configuration and establishing an electrical connection between the coil and the return path,
wherein, in the closed-loop configuration, the at least two walls of the combined unit overlap at least a portion of the coil along the axis of the coil, the longitudinal axis of the opening of the combined unit is generally parallel to the axis of the coil, the first end of the flexible carrier is offset from the second end of the carrier along a direction transverse to the longitudinal axis of the opening, and a free end of the coil is flush with a terminated end of the coil in a plane perpendicular to the axis of the coil.

19. The sensor of claim 1, further comprising a sensor electronics chip disposed in a portion of the flexible carrier, the sensor electronics chip configured to process electrical signals.

20. The sensor of claim 1, wherein, in the closed configuration, the sensor comprises a loop having a fixed predetermined diameter.

21. The sensor of claim 1, wherein the free end and the terminated end of the coil are aligned within an error margin of ±10%.

22. The method of claim 18, wherein, in the closed configuration, the sensor comprises a loop having a fixed predetermined diameter.

* * * * *